United States Patent
Choi et al.

(10) Patent No.: US 6,949,793 B2
(45) Date of Patent: Sep. 27, 2005

(54) MEMORY DEVICE WITH QUANTUM DOT AND METHOD FOR MANUFACTURING THE SAME

(75) Inventors: Won-bong Choi, Kyungki-do (KR); Soo-doo Chae, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/225,431

(22) Filed: Aug. 22, 2002

(65) Prior Publication Data

US 2003/0153151 A1 Aug. 14, 2003

(30) Foreign Application Priority Data

Feb. 9, 2002 (KR) .......................................... 2002-7708

(51) Int. Cl.[7] .......................................... H01L 29/788
(52) U.S. Cl. .......................................... 257/316
(58) Field of Search .......................... 438/257–267; 257/315–324

(56) References Cited

U.S. PATENT DOCUMENTS

| | | | |
|---|---|---|---|
| 5,801,401 A | | 9/1998 | Forbes |
| 5,937,295 A | * | 8/1999 | Chen et al. .................. 438/257 |
| 5,952,692 A | * | 9/1999 | Nakazato et al. ........... 257/321 |
| 6,060,743 A | * | 5/2000 | Sugiyama et al. .......... 257/321 |
| 6,165,842 A | * | 12/2000 | Shin et al. ................... 438/257 |
| 6,297,095 B1 | | 10/2001 | Muralidhar et al. |
| 6,300,193 B1 | * | 10/2001 | Forbes ........................ 438/257 |
| 6,331,463 B1 | | 12/2001 | Chen |
| 6,723,606 B2 | * | 4/2004 | Flagan et al. ............... 438/264 |
| 2002/0098653 A1 | * | 7/2002 | Flagan et al. ............... 438/260 |

FOREIGN PATENT DOCUMENTS

| | | |
|---|---|---|
| KR | 2000-0008634 A | 2/2000 |
| KR | 2001-0001057 A | 1/2001 |
| WO | 01/88988 A1 | 11/2001 |

OTHER PUBLICATIONS

European Search Report issued by the European Patent Office on Jul. 5, 2004 in corresponding application 02 25 5824.

M. Ikeda et al., "Charge Injection Characteristics of a Si Quantum Dot Floationg Gate in MOS Structures," Extended Abstracts of the 2001 International Conference on Solid State Devoces and Materials, Tokyo, Japan, vol. 2001, Sep. 26, 2001, pp. 308–309.

F. Sabri et al., "Charge storage in GaAs metal insulator semiconductor field effect transistor metal nanodot memory structures," Applied Physics Letters, American Institute of Physics, New York, US, vol. 74, No. 20, May 17, 1999, pp 2996–2998.

* cited by examiner

*Primary Examiner*—Richard A. Booth
(74) *Attorney, Agent, or Firm*—Burns, Doane, Swecker & Mathis, L.L.P.

(57) ABSTRACT

Provided is a memory device formed using quantum devices and a method for manufacturing the same. A memory device comprises a substrate; a source region and a drain region formed in the substrate so as to be separated from each other by a predetermined interval; a memory cell which is formed on the surface of the substrate to connect the source region and the drain region, and has a plurality of nano-sized quantum dots filled with material for storing electrons; and a control gate which is formed on the memory cell and controls the number of electrons stored in the memory cell. It is possible to embody a highly efficient and highly integrated memory device by providing a memory device having nano-sized quantum dots and a method for manufacturing the same.

8 Claims, 6 Drawing Sheets

MEMORY DEVICE WITH QUANTUM DOT AND METHOD FOR MANUFACTURING THE SAME

Priority is claimed to Patent Application Number 2002-7708 filed in Republic of Korea on Feb. 9, 2002, herein incorporated by reference.

BACKGROUND OF THE INVENTION

1. Field of the Invention

The present invention relates to a memory device and a method for manufacturing the same, and more particularly, to a memory device which is a single electron device and a method for manufacturing the same.

2. Description of Related Art

A semiconductor memory device includes two fundamental components: a transistor used as a switch for obtaining current paths, when writing or reading information onto or from a capacitor, and a capacitor for keeping the stored electric charges.

It is necessary for a transistor to have a high transconductance (gm) characteristic so that a great deal of current flows in the transistor. Therefore, recent memory devices include Metal Oxide Semiconductor Field Effect Transistors (MOSFETS) adapted as switching devices, since they have a high transconductance. The MOSFET is a transistor including two fundamental components, i.e., a gate electrode formed of doped polycrystalline silicon, and a source electrode and a drain electrode formed of doped crystalline silicon.

Recently, research has been carried out to try and reduce the size of a device to embody a highly integrated memory device. The smaller the size of a device, the more devices can be integrated in a unit volume, and the less time is required for transmitting signals between the devices. Accordingly, the miniaturization of devices is advantageous for high speed handling of a great amount of information.

However, the existing MOSFET generates a large amount of heat. If a lot of devices adapting the MOSFET are integrated in a small area, the devices may melt down or cause malfunctions.

To overcome the above problems, one of the next generational devices under development is a single electron device SED. A single electron device refers to a device using a Coulomb Blockade effect, i.e., a phenomenon in which an electron is blocked from tunneling into a dot by the classical Coulomb repulsive force of another electron which already exists inside the dot.

In general, the current-voltage characteristic of a tunnel junction having a size of less than 100 nm and a relatively high resistance does not follow ohm's law and a current generated by transmitting electrons under low voltage is reduced to almost 0. This phenomenon occurs when a transmitted electron interacts with an electric field charged with the electron by the electrostatic force. This phenomenon was published in a theory based on quantum mechanics by Likharev et al. in 1986 and observed in an artificial infinitesimal junction in 1987 for the first time.

Theoretically, the single electron device can operate with a single electron under a certain temperature. Here, the certain temperature refers to a temperature of which a thermal energy $K_B T$ lower than the electrostatic energy $e^2/C$ which is required with an electron in a junction inside a device; in other words, a temperature which meets the following equation.

$$T << \frac{e^2}{K_B \times C} \qquad \text{[mathematic formula 1]}$$

Here, $K_B (=1.38 \times 10^{-23}$ J/K) is the Boltzmann's constant. Capacitance C increases in proportion to the rise in temperature of a junction. Therefore it is possible to observe the Coulomb Blockade effect at any temperature, if only the size of the junction is reduced. It is notable that the size of the junction should be reduced to less than 10 nm×10 nm and the size of a quantum dot for storing an electrode should also be reduced to less than 10 nm. However, it is difficult to obtain a junction or a quantum dot of this size.

SUMMARY OF THE INVENTION

It is an object of the present invention to provide a highly efficient and highly integrated memory device which is capable of controlling the size of a quantum dot and has excellent abilities of storing electrons in order to embody a single electron device.

To achieve the object of the present invention, there is provided a memory device comprising: a substrate; a source region and a drain region formed in the substrate so as to be separated from each other by a predetermined interval; a memory cell which is formed on the surface of the substrate to connect the source region and the drain region, and has a plurality of nano-sized quantum dots filled with material for storing electrons; and a control gate which is formed on the memory cell and controls the number of electrons stored in the memory cell. The memory device may comprises; an insulating layer positioned under the gate electrode; and a porous storage layer which is positioned under the insulating layer and on which a plurality of quantum dots filled with materials for storing electrons, are arranged.

It is preferable that the memory device further comprises a tunneling layer positioned between the porous storage layer and the substrate, and through which an electron passes. The insulating layer and the tunneling layer may be one of silicon oxide layer, aluminum oxide layer, silicon oxynitride layer, tantalum oxide layer, hafnium oxide layer, zirconium oxide layer or STO layer, and the porous storage layer may be an aluminum oxide layer. The material for storing electrons may be made of one of silicon, silicon nitride and metal.

To achieve the object of the present invention, there is provided a method for manufacturing a memory device, comprising; forming a source region and a drain region in the surface of the substrate, which are separated from each other by a predetermined interval; depositing a layer for storing an electron between the source region and the drain region; forming a porous storage layer for forming a plurality of holes by oxidizing the storage layer; depositing a material for storing electrons inside the holes; etching and planarizing the porous storage layer; forming an insulating layer on the planarized surface of the storage layer; and forming a control gate on the insulating layer.

To achieve the object of the present invention, there is provided a method for manufacturing a memory device, comprising; forming a storage layer on a substrate; forming a porous storage layer by forming a plurality of holes by oxidizing the storage layer; depositing a material for storing electrons inside the holes; etching and planarizing the porous storage layer; forming an insulating layer on the planarized surface of the storage layer; forming a control gate on the insulating layer; and forming a source region and a drain region on both sides of the porous storage layer on the surface of the substrate, which are separated by predetermined intervals.

It is preferable that the act of forming the storage layer further comprises; forming a tunneling layer, through which an electron passes, on the substrate before forming the storage layer. The act of forming the porous storage layer may comprises; a first etch for forming a porous storage layer by forming a plurality of holes by oxidizing the storage layer; widening for widening the plurality of holes by reoxidizing the porous storage layer; and a second etch for reducing the height of the porous storage layer by etching.

The storage layer may be formed of aluminum. The material for storing electrons may be formed of one of silicon, silicon nitride and metal. It is preferable that the insulating layer and the tunneling layer are formed of silicon oxide.

The insulating layer and the tunneling layer may be one of silicon oxide layer, aluminum oxide layer, silicon oxynitride layer, tantalum oxide layer, hafnium oxide layer, zirconium oxide layer or STO layer.

The present invention embodies a single electron device using the structure of a conventional semiconductor memory device. It is possible to control the size of a quantum dot to be less than 10 nm and provide a highly effective and integrated memory device by filling the quantum dot with a material for storing electrons.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention will now be described more fully with reference to the accompanying drawings, in which a memory device according to preferred embodiments of the invention are shown and a method for manufacturing the same.

Figure 1:
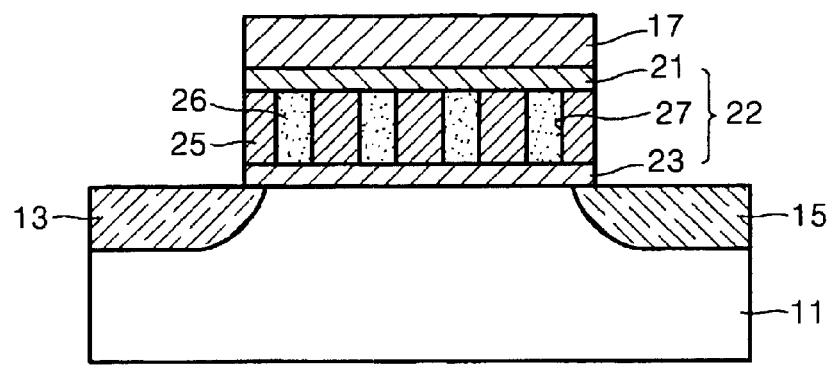
FIG. 1 is a cross-sectional view of a memory device according to an embodiment of the present invention.

FIG. 1 is a view showing a memory device having a quantum dot according to an embodiment of the present invention. Referring to FIG. 1, the memory device having a quantum dot according to the embodiments of the present invention comprises a substrate 11; a source region 13 and a drain region 15 formed in the substrate so as to be separated from each other by a predetermined interval; a memory cell 22 which is formed on the surface of the substrate 11 to connect the source region 13 and the drain region 15, and has a plurality of nano-sized quantum dots 27 filled with material for storing electrons; and a control gate 17 which is formed on the memory cell 22 and controls the number of electrons stored in the memory cell 22.

The substrate 11 is a semiconductor substrate made of silicon. A source region 13 and a drain region 15 can be formed of an n-type or a p-type semiconductor by a diffusion process after a doping process of a general semiconductor process. The memory cell 22 comprises; an insulating layer 21 positioned under the gate electrode 17; and a porous storage layer 25 which is positioned under the insulating layer 21 and on which a plurality of quantum dots 27 filled with materials 26 for storing electrons, are arranged. A tunneling layer 23 can be further positioned between the porous storage layer 25 and the substrate 11, and through which an electron passes.

The insulating layer 21 and the tunneling layer 23 can be formed of silicon oxide $SiO_2$, aluminum oxide $Al_2O_3$, silicon oxynitride SiON, tantalum oxide $Ta_2O_5$, hafnium oxide $HfO_2$, zirconium oxide $ZrO_2$ or STO $SrTiO_3$. The porous storage layer 25 can be an aluminum oxide layer. The material 26 for storing electrons is made of one of silicon, silicon nitride and metal. The porous storage layer 25 is first formed of aluminum and changed into aluminum oxide, or alumina by oxidation, forming a quantum dot. An insulating layer 21 or a tunneling layer 23 can be formed to have a thickness of several nm to several tens of nm. Preferably the quantum dot 27 is formed to have a thickness of less than 10 nm.

If the source region 13 is grounded and a certain voltage Vd>0 is applied to the drain region 15, an electron moves from the source region 13 to the drain region 15. In this process, if the gate voltage Va is larger than the drain voltage Vb, the electron moves into the memory cell 22. Here, the number of electrons which tunnel through the tunneling layer 23 is determined by the thickness and the material of the tunneling layer 23. If there is no tunneling layer 23, the number of electrons stored in the quantum dot 27 is determined by the size of the quantum dot 27 and the characteristics of the inner material of the quantum dot 27.

If an electron moves inside the quantum dot 27, other electrons are blocked from moving into the quantum dot 27 by the Coulomb Blockade effect, in other words, a Coulomb repulsive force. If the gate voltage Va is increased to a certain voltage, more electrons can move into the quantum dot 27 by overcoming the Coulomb repulsive force.

When writing to the memory, if the gate voltage Va remains 0 in the above state, the tunneling is eliminated and the materials Si and $Si_3N_4$ for storing electrons in the quantum dot 27 are combined with electrons, thereby writing information to the memory. In a case where many electrons are stored by controlling the gate voltage Va, the gate voltage remains 1, and in a case where some electrons are stored, the gate voltage remains 0.

When reading from the memory, if a voltage lower than the gate voltage Va in the case of writing is applied to the drain region 15, and the gate voltage Va remains 0, it is determined by the threshold voltage of the memory cell whether or not a current flows in the cell. By measuring the drain voltage, 0 or 1 can be read.

When erasing the memory, the gate voltage Va is set to 0, a high voltage is applied to the source region 13 and the drain region is open circuited, electrons move into the source region 13, and then information in the memory cell 22 is erased.

The present invention has been particularly described with reference to preferred embodiments of a memory device for describing the operations of reading, writing, and erasing in the case that the memory device is used as a Read Only Memory ROM.

If the memory device according to the present embodiment of the invention operates as a Random Access Memory RAM, a memory cell 22 performs the same operations as the capacitor. In this case, the quantum dot 27 stores a small amount of electric charge, which is easily erased if there is a low leakage current; therefore rewriting is required.

If the source region 13 is grounded and a predetermined voltage is applied to the drain region 15, an electron moves from the source region 13 to the drain region 15. In this process, if the gate voltage Va is set to be larger than the drain voltage Vd, the electron moves into the memory cell 22, tunnels through the tunneling layer 23 and is stored in the quantum dot 27. The above principle is also applicable to a memory device used as a RAM as described above, but is different from the ROM in that the electrons stored in the RAM are removed if power is no longer supplied. This is because a RAM can store electrons for only a short time.

Figure 2:
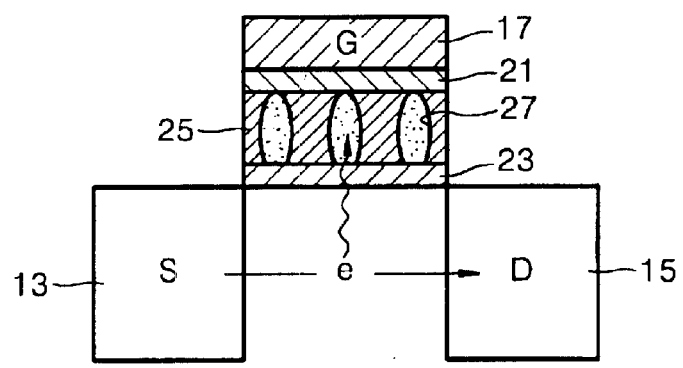
FIG. 2 is a conceptual diagram showing a principle of a memory device according to an embodiment of the present invention.

FIG. 2 is a conceptual diagram showing a principle in which an electron is stored in a memory device according to an embodiment of the present invention. FIG. 2 shows that an electron, moving from the source region 13 to the drain region 15, moves into the quantum dot 27 due to the gate voltages Va applied to the control gate 17.

Figure 3:
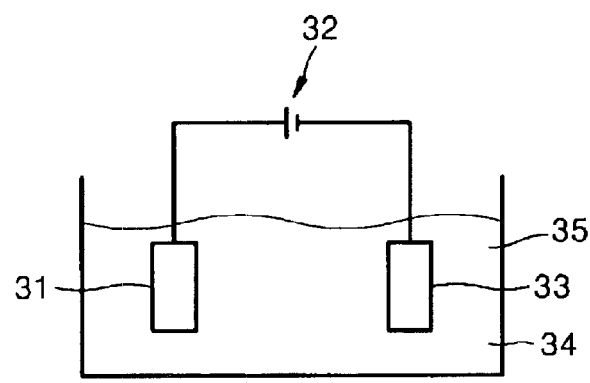
FIG. 3 is a device for forming a quantum dot among methods for manufacturing a memory device according to an embodiment of the present invention.

FIG. 3 is a device for oxidizing the storage layer of a memory cell in a device for manufacturing a memory device according to an embodiment of the present invention.

FIGS. 4a through 4g are views showing a method for manufacturing the memory device according to an embodiment of the present invention.

Figure 4A:
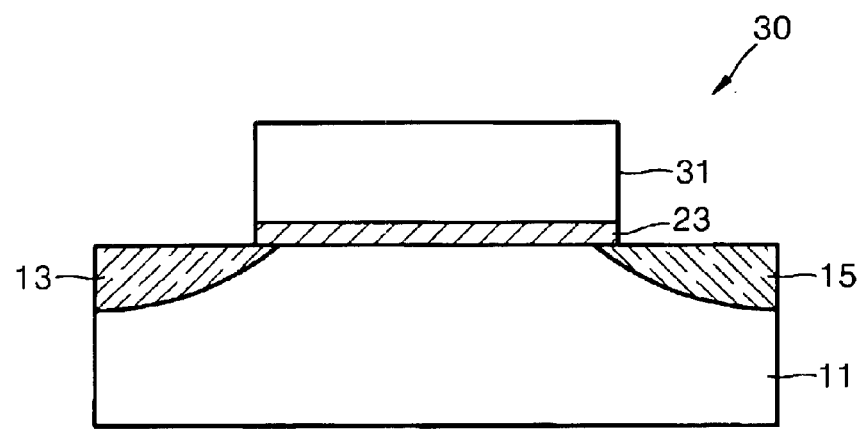
FIGS. 4a through 4g are cross-sectional views showing a method for manufacturing a memory device according to a first embodiment of the present invention.
Figure 4B:
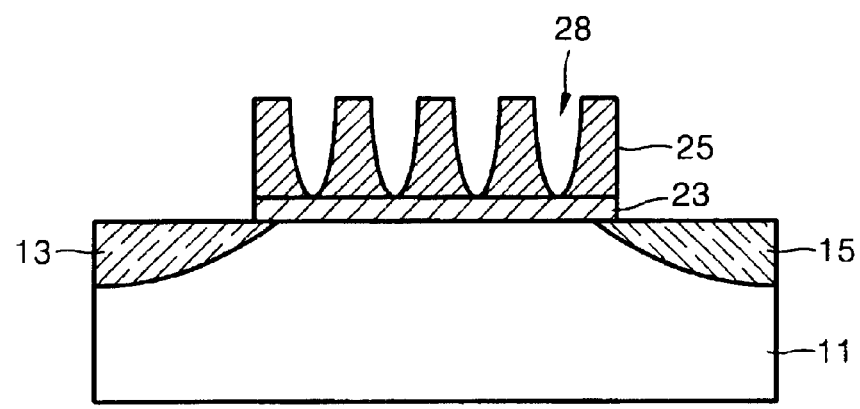

As shown in FIG. 4a, a silicon substrate 11 is prepared first. A source region 13 and a drain region 15 separated by a predetermined interval are formed in the substrate 11 by an ion implantation or a diffusion process of a general semiconductor process. Next, an oxide layer 23 such as a silicon oxide layer is layered on the surface of the substrate 11 to partially overlap the source region 13 and the drain region 15. Next, an aluminum layer 31 is formed on the oxide layer 23, and then oxidized using the device shown in FIG. 3.

If the structure shown in FIG. 4a is placed in a vessel 34 filled with sulfuric acid $H_2SO_4$ or phosphoric acid $H_3PO_4$ solution 35 having a density of 0.1M through 1M shown in FIG. 3 and a voltage is applied via the power supply 32, the aluminum layer 31 is oxidized by electrolysis of the solution 35 between the electrode 33 and the structure 30. Here, it is preferable that the applied voltage ranges from 1V to 30V, the temperature of the sulfuric acid $H_2SO_4$ ranges from 0 to 30° C., and the phosphoric acid $H_3PO_4$ solution ranges 0 to 30° C. As the electrode 33, lead Pt or graphite is used.

Figure 4C:
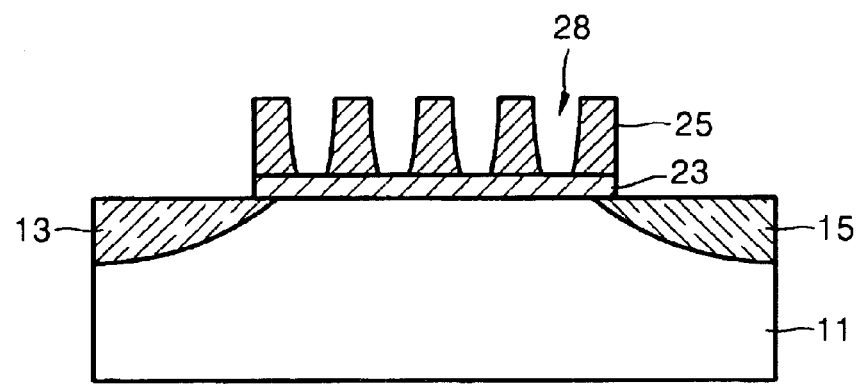

If the aluminum layer 31 is oxidized using the device in FIG. 3, the aluminum layer 31 is changed into aluminum oxide, in other words, an alumina layer 25, forming a plurality of holes 28 with a size of less than 10 nm as shown in 4b. If the widening process for oxidizing the structure, in which a plurality of holes 28 are formed, is performed using the device in FIG. 3, the width of the hole 28 is widened as shown in FIG. 4c. Next, if the holes 28 in the alumina layer 25 are etched using a high density plasma technology such as, Reactive Ion Etch RIE, Magnetically Enhanced Reactive Ion Etch MERIE, Electron Cyclotron Resonance ECR, Inductive Coupled Plasma ICP etc., the height of the holes are reduced and formed into a quantum dot 27.

Figure 4D:
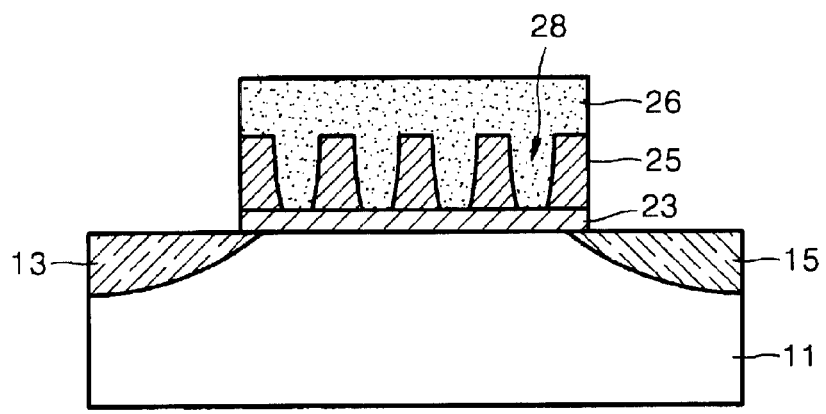
Figure 4E:
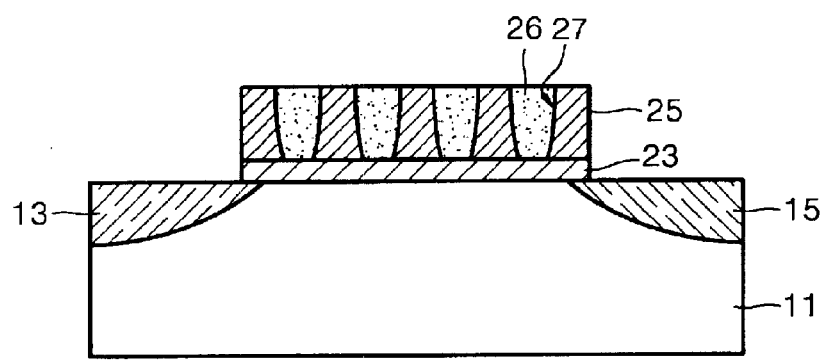

FIG. 4d shows a act in which materials for storing electrons Si and $Si_3N_4$ 27 are deposited in the holes 28 by a sputtering or a chemical mechanical deposition CVD etc. after the widening and etching have been completed. Next, the height of the material layer 26 forming the quantum dot 27 for storing electrons is adjusted to be equal to that of the quantum dot 27 by performing wet or dry etching as shown in FIG. 4e, forming the electron storage layer 25.

Figure 4F:
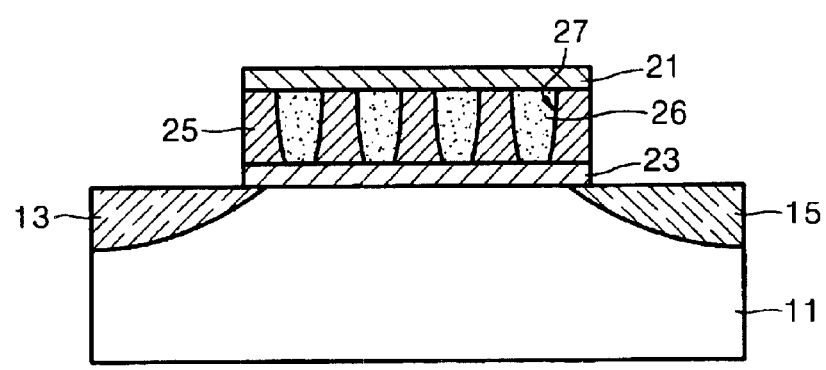
Figure 4G:
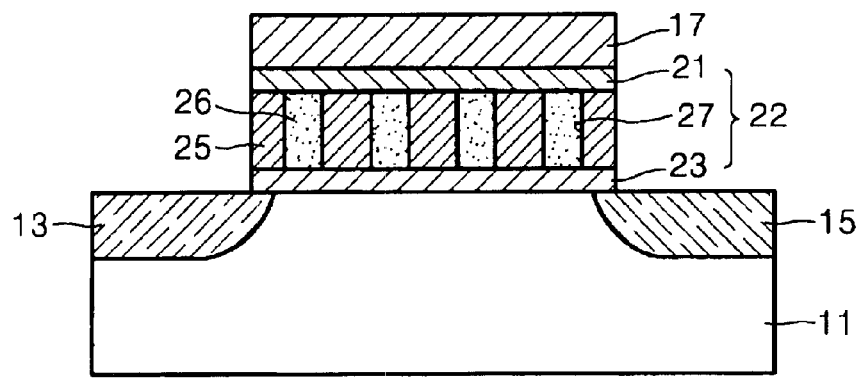

An insulating layer 21, such as a silicon oxide layer is formed on the electronic storage layer 25 to form a structure in FIG. 4f, and forming a control gate 17 on the insulating layer 21 completes a memory device according to an embodiment of the present invention. Here, the source region 13 and the drain region 15 can be first formed as shown in FIG. 4a, but can also be formed by an ion implantation method or a diffusion method at the end of a semiconductor process, after the control gate 17 in FIG. 4g has been formed, as shown in FIGS. 5a through 5h.

Figure 5A:
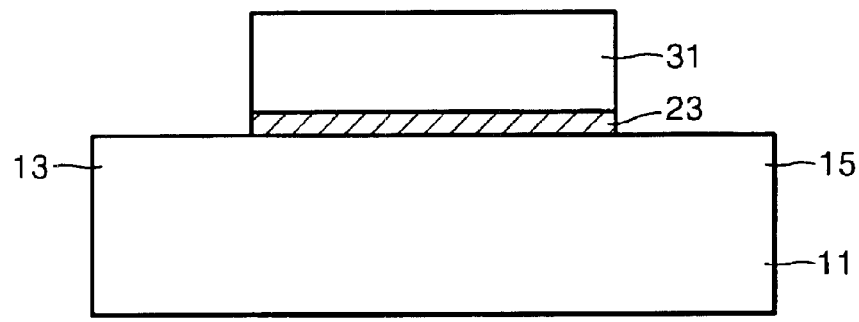
FIGS. 5a through 5h are cross-sectional views for explaining a method for manufacturing a memory device according to a second embodiment of the present invention.
Figure 5B:
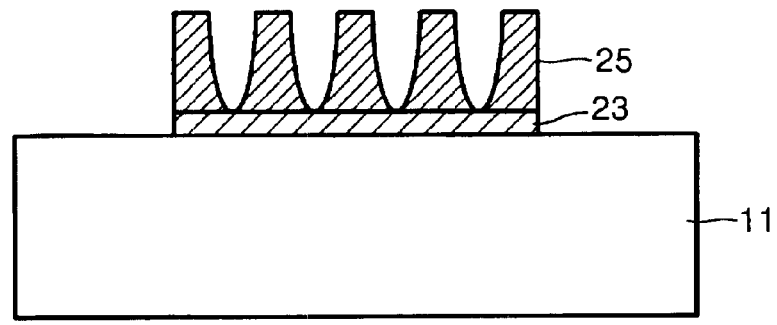
Figure 5C:
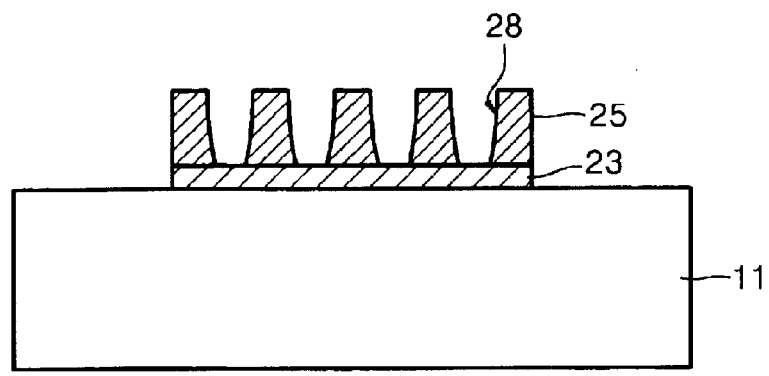
Figure 5D:
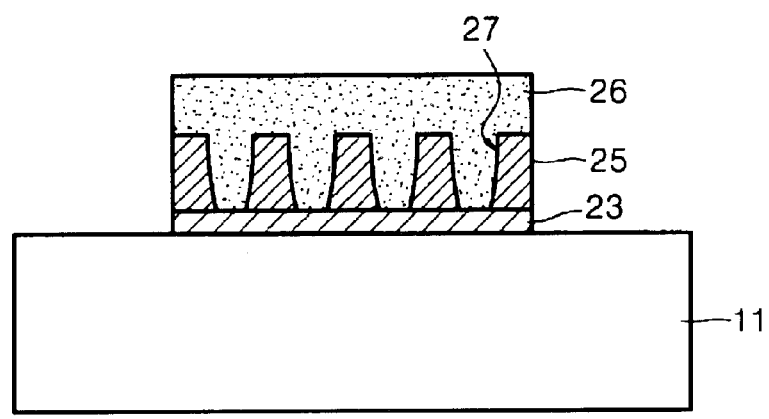
Figure 5E:
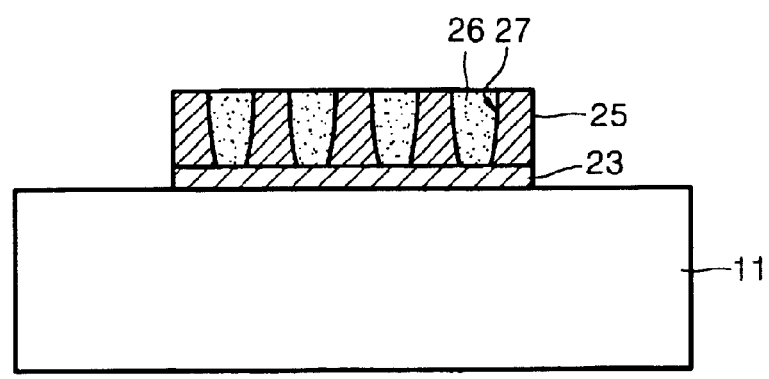
Figure 5F:
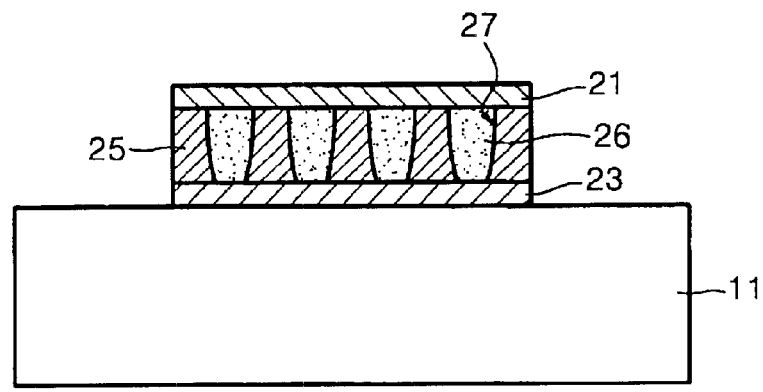
Figure 5G:
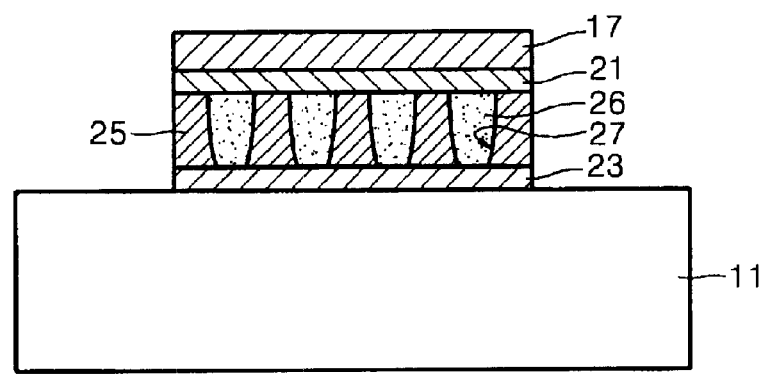

As shown in FIG. 5a, an oxide layer 23 can be directly formed on the substrate 11, instead of forming a source region 13 and a drain region 15. Next, an electron storage layer 31 is deposited on the oxide layer 23. If the electron storage layer 31 is oxidized as described in FIG. 4b, a porous storage layer is formed as shown in FIG. 5b. Then, the structure is completed by performing the widening and etching processes described with reference to FIGS. 4c through 4f, as shown in FIGS. 5c through 5f, and a control gate 17 is deposited, resulting in the structure shown in FIG. 5g.

Figure 5H:
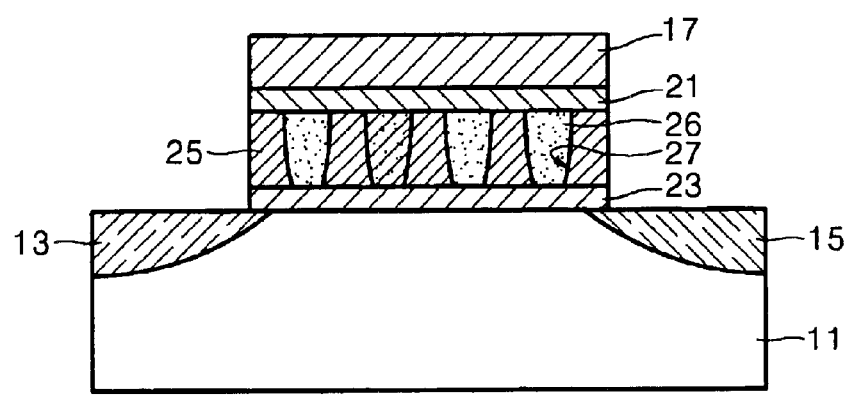

Next, the control gate 17 is layered on the substrate 11 and impurities are implanted in the substrate 11, the source region 13 and the drain region 15 are formed as shown in FIG. 5h.

Unlike FIGS. 4a through 4f, the processes shown in FIGS. 5a through 5h are simplified by omitting a process for using a mask by forming the source region 13 and the drain region 15 later than the control gate 17.

The memory device and the method for manufacturing the same according to the embodiments of the present invention can embody a highly effective and highly integrated memory device by comprising an electronic storage layer of a porous thin film. While this invention has been particularly shown and described with reference to preferred embodiments thereof, the preferred embodiments described above are merely illustrative and are not intended to limit the scope of the invention.

It is obvious that one of ordinary skill in the art can use a material capable of capturing electrons more effectively with an electronic storage layer with the concept of the present invention. Accordingly, it is apparent that variations and modifications can be made by those skilled in the art within the spirit and the scope of the present invention defined in the appended claims, rather than the preferred embodiments set forth herein.

As described above, an advantage of the memory device and the method for manufacturing the same according to the present invention is to provide a highly effective and highly integrated memory device by storing electrons using a porous electron storage layer, on which a nano-sized quantum dot is formed.

What is claimed is:

1. A memory device comprising:
   a substrate;
   a source region and a drain region formed in the substrate so as to be separated from each other by a predetermined interval;
   a memory cell which is formed on the surface of the substrate to connect the source region and the drain region, and has a plurality of nano sized quantum dots filled with material for storing electrons arranged in a storage layer of porous material;

a control gate which is formed on the memory cell and controls the number of electrons stored in the memory cell; and an insulating layer positioned under the control gate, wherein the porous storage layer which is positioned under the insulating layer in which a plurality of quantum dots, filled with materials for storing electrons, are arranged.

2. The memory device of claim 1, further comprising a tunneling layer positioned between the porous storage layer and the substrate, and through which an electron passes.

3. The memory device of claim 1, wherein the insulating layer and the tunneling layer are one of silicon oxide layer, aluminum oxide layer, silicon oxynitride layer, tantalum oxide layer, hafnium oxide layer, zirconium oxide layer and STO layer.

4. The memory device of claim 2, wherein the insulating layer and the tunneling layer are one of silicon oxide layer, aluminum oxide layer, silicon oxynitride layer, tantalum oxide layer, hafnium oxide layer, zirconium oxide layer and STO layer.

5. The memory device of claim 1, wherein the storage layer is an aluminum oxide layer.

6. The memory device of claim 2, wherein the storage layer is an aluminum oxide layer.

7. The memory device of claim 1, wherein the material for storing electrons is made of one of silicon, silicon nitride and metal.

8. The memory device of claim 2, wherein the material for storing electrons is made of one of silicon, silicon nitride and metal.

* * * * *